United States Patent
Wang et al.

(10) Patent No.: US 12,396,369 B2
(45) Date of Patent: Aug. 19, 2025

(54) METHOD FOR FABRICATING SEMICONDUCTOR STRUCTURE AND SEMICONDUCTOR STRUCTURE

(71) Applicants: CHANGXIN MEMORY TECHNOLOGIES, INC., Hefei (CN); Beijing Superstring Academy of Memory Technology, Beijing (CN)

(72) Inventors: Xiaoguang Wang, Hefei (CN); Huihui Li, Hefei (CN); Qiang Zhang, Hefei (CN); Shan Wang, Hefei (CN); Minmin Wu, Hefei (CN)

(73) Assignees: CHANGXIN MEMORY TECHNOLOGIES, INC., Hefei (CN); BEIJING SUPERSTRING ACADEMY OF MEMORY TECHNOLOGY, Beijing (CN)

(*) Notice: Subject to any disclaimer, the term of this patent is extended or adjusted under 35 U.S.C. 154(b) by 706 days.

(21) Appl. No.: 17/847,186

(22) Filed: Jun. 23, 2022

(65) Prior Publication Data
US 2023/0172074 A1 Jun. 1, 2023

Related U.S. Application Data

(63) Continuation of application No. PCT/CN2022/077794, filed on Feb. 25, 2022.

(30) Foreign Application Priority Data

Nov. 30, 2021 (CN) .......................... 202111447165.X

(51) Int. Cl.
*H10N 50/80* (2023.01)
*H10N 50/01* (2023.01)

(52) U.S. Cl.
CPC ............. *H10N 50/80* (2023.02); *H10N 50/01* (2023.02)

(58) Field of Classification Search
None
See application file for complete search history.

(56) References Cited

U.S. PATENT DOCUMENTS 7,115,525 B2 10/2006 Abatchev et al.
8,142,986 B2 3/2012 Sim et al.
(Continued)

FOREIGN PATENT DOCUMENTS

CN 101512726 B 11/2011
CN 104716160 A 6/2015
(Continued)

OTHER PUBLICATIONS

United States Patent and Trademark Office, Final office action issued in related U.S. Appl. No. 17/853,877 on Feb. 29, 2024.
(Continued)

*Primary Examiner* — Sue A Purvis
*Assistant Examiner* — Jordan M Klein
(74) *Attorney, Agent, or Firm* — Kilpatrick Townsend & Stockton LLP

(57) ABSTRACT

Embodiments relate to the field of semiconductor manufacturing technology, and more particularly, to a method for fabricating a semiconductor structure and a semiconductor structure. The fabricating method includes: providing a substrate including an array region and a peripheral region; and forming, on the substrate, a first mask layer covering the array region and the peripheral region, the first mask layer having a first device structure pattern directly facing the array region and a second device structure pattern directly facing the peripheral region. Through the method for fabricating a semiconductor structure, the first mask layer having
(Continued)

the first device structure pattern and the second device structure pattern is formed on the substrate, and then the substrate is etched by using the first device structure pattern and the second device structure pattern as mask layer to synchronously form a peripheral region structure and an array region structure on the substrate.

14 Claims, 8 Drawing Sheets

(56) References Cited

U.S. PATENT DOCUMENTS

| | | | |
|---|---|---|---|
| 8,546,202 B2 | 10/2013 | Tung et al. | |
| 8,890,110 B2 | 11/2014 | Park | |
| 9,209,038 B2* | 12/2015 | Cantone | H10D 84/038 |
| 9,324,570 B1 | 4/2016 | Liou | |
| 9,916,978 B2 | 3/2018 | Hsu et al. | |
| 10,224,213 B2 | 3/2019 | Byun et al. | |
| 10,312,090 B2 | 6/2019 | Chang et al. | |
| 10,566,236 B2 | 2/2020 | Boemmels | |
| 2005/0056888 A1 | 3/2005 | Youn et al. | |
| 2006/0292497 A1 | 12/2006 | Kim | |
| 2007/0202705 A1 | 8/2007 | Kim et al. | |
| 2008/0070165 A1 | 3/2008 | Fischer et al. | |
| 2009/0035902 A1* | 2/2009 | Xu | H10D 84/038 |
| | | | 257/E21.409 |
| 2011/0017971 A1 | 1/2011 | Kim et al. | |
| 2013/0001750 A1 | 1/2013 | Arnold et al. | |
| 2013/0043525 A1 | 2/2013 | Yu et al. | |
| 2013/0161700 A1 | 6/2013 | Durga et al. | |
| 2013/0337652 A1 | 12/2013 | Sun et al. | |
| 2015/0243519 A1 | 8/2015 | Devilliers | |
| 2016/0181100 A1 | 6/2016 | Devilliers et al. | |
| 2016/0314983 A1* | 10/2016 | Han | H10D 84/038 |
| 2017/0077103 A1 | 3/2017 | Park et al. | |
| 2018/0158526 A1 | 6/2018 | Kim et al. | |
| 2018/0374899 A1 | 12/2018 | Yoshida et al. | |
| 2019/0035631 A1 | 1/2019 | Chang et al. | |
| 2019/0181014 A1 | 6/2019 | Chang et al. | |
| 2019/0378717 A1 | 12/2019 | Sung et al. | |
| 2020/0321521 A1 | 10/2020 | Hsu et al. | |
| 2022/0059349 A1* | 2/2022 | Kuo | H01L 21/32139 |
| 2023/0068802 A1 | 3/2023 | Wang et al. | |
| 2023/0078443 A1* | 3/2023 | Wu | H01L 21/32139 |
| | | | 438/669 |

FOREIGN PATENT DOCUMENTS

| | | |
|---|---|---|
| CN | 104752359 A | 7/2015 |
| CN | 105826268 A | 8/2016 |
| CN | 106024790 A | 10/2016 |
| CN | 108133936 A | 6/2018 |
| CN | 108598081 A | 9/2018 |
| CN | 109285831 A | 1/2019 |
| CN | 109285857 A | 1/2019 |
| CN | 109559978 A | 4/2019 |
| CN | 110534517 A | 12/2019 |
| CN | 113053943 A | 6/2021 |
| CN | 113097143 A | 7/2021 |
| CN | 113363379 A | 9/2021 |
| CN | 113410255 A | 9/2021 |
| CN | 113707614 A | 11/2021 |

OTHER PUBLICATIONS

United States Patent and Trademark Office, Non-Final office action issued in related U.S. Appl. No. 17/853,877 on Aug. 29, 2023.
Non-final office action issued in U.S. Appl. No. 17/826,177 mailed on Mar. 27, 2025, 11 pages.

* cited by examiner ing a semiconductor structure and a semiconductor structure. The method includes: providing a substrate comprising an array region and a peripheral region; forming, on the substrate, a first mask layer covering the array region

METHOD FOR FABRICATING SEMICONDUCTOR STRUCTURE AND SEMICONDUCTOR STRUCTURE

CROSS-REFERENCE TO RELATED APPLICATION

This application is a continuation of PCT/CN2022/077794, filed on Feb. 25, 2022, which claims priority to Chinese Patent Application No. 202111447165X titled "METHOD FOR FABRICATING SEMICONDUCTOR STRUCTURE AND SEMICONDUCTOR STRUCTURE" and filed to the State Intellectual Property Office on Nov. 30, 2021, the entire contents of which are incorporated herein by reference.

TECHNICAL FIELD

Embodiments of the present disclosure relate to the field of semiconductor manufacturing technology, and more particularly, to a method for fabricating a semiconductor structure and a semiconductor structure.

BACKGROUND

A semiconductor structure (such as a memory) includes a substrate and a device layer arranged on the substrate. Furthermore, the semiconductor structure also includes a peripheral region and an array region adjacent to the peripheral region. Corresponding device layers in the array region and the peripheral region are provided with corresponding Metal Oxide Semiconductor Field Effect Transistors (MOS transistors); and the substrate in the array region and the substrate in the peripheral region have mating structures configured to mate with the corresponding device layers. During fabrication, the mating structures in the array region and the peripheral region are fabricated separately, and then the device layers are formed to complete the fabrication of the semiconductor structure.

However, in related technologies, the mating structures on the substrate of the array region and the substrate of the peripheral region need to be fabricated separately, resulting in lower production efficiency.

SUMMARY

According to some embodiments, a first aspect of the present disclosure provides a method for fabricating a semiconductor structure, including: providing a substrate comprising an array region and a peripheral region; forming, on the substrate, a first mask layer covering the array region and the peripheral region, such that the first mask layer has a first device structure pattern over the peripheral region and a second device structure pattern over the array region; and etching the substrate by using the first device structure pattern and the second device structure pattern as mask layer to form a peripheral region structure and an array region structure, respectively.

According to some embodiments, a second aspect of the present disclosure also provides a semiconductor structure, which is formed by the above method for fabricating a semiconductor structure.

Embodiments of the present disclosure provide a method for fabricating a semiconductor structure and a semiconductor structure. The method includes: providing a substrate comprising an array region and a peripheral region; forming, on the substrate, a first mask layer covering the array region and the peripheral region, such that the first mask layer has a first device structure pattern directly facing the array region and a second device structure pattern directly facing the peripheral region; and etching the substrate by using the first device structure pattern and the second device structure pattern as mask layer to form a peripheral region structure and an array region structure, respectively. According to the method for fabricating a semiconductor structure provided by the embodiments of the present disclosure, the first mask layer having the first device structure pattern and the second device structure pattern is first formed on the substrate, and then the substrate is etched by using the first device structure pattern and the second device structure pattern as mask layer to synchronously form a peripheral region structure and an array region structure on the substrate, thereby simplifying technological processes, reducing fabrication difficulties, and improving production efficiencies.

BRIEF DESCRIPTION OF THE DRAWINGS

To describe the technical solutions in the embodiments of the present disclosure or the existing technologies more clearly, the accompanying drawings required for describing the embodiments or the existing technologies will be briefly introduced below. Apparently, the accompanying drawings in the following description are merely some embodiments of the present disclosure. To those of ordinary skills in the art, other accompanying drawings may also be derived from these accompanying drawings without creative efforts.

DETAILED DESCRIPTION

Several implementation manners of the present disclosure are introduced below in conjunction with the accompanying drawings. Those skilled in the art should understand that the following implementation manners are only illustrative, and are not exhaustive enumerations. On the basis of these implementation manners, those skilled in the art may replace, concatenate or combine some features or some examples, which should still be regarded as disclosed contents of the present disclosure.

Figure 1:
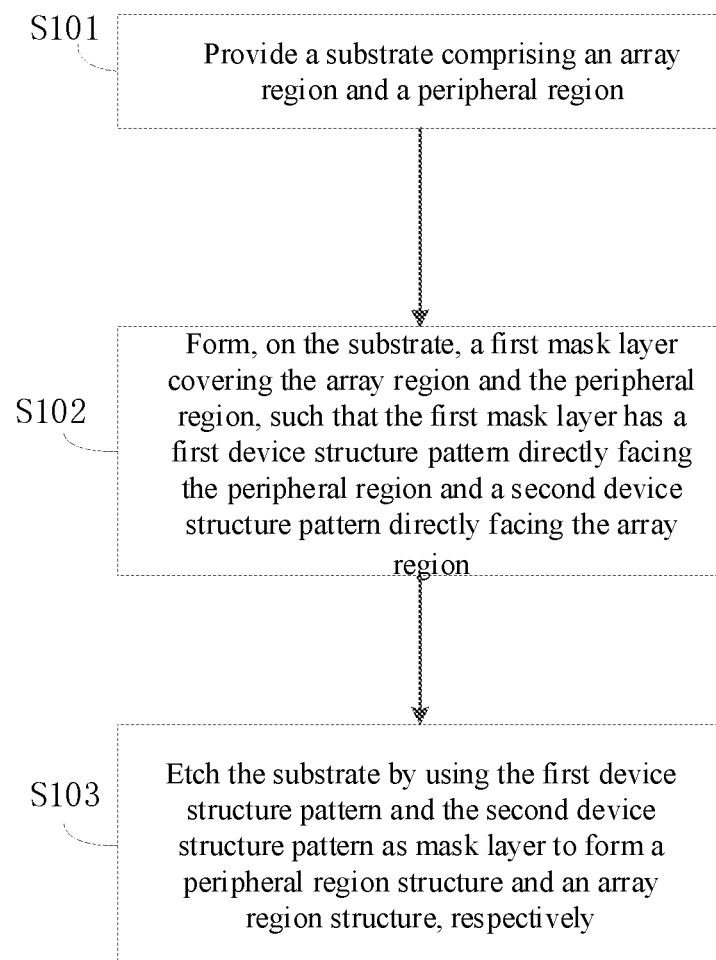
FIG. 1 is a flowchart showing steps of a method for fabricating a semiconductor structure according to an embodiment of the present disclosure.
Figure 2:
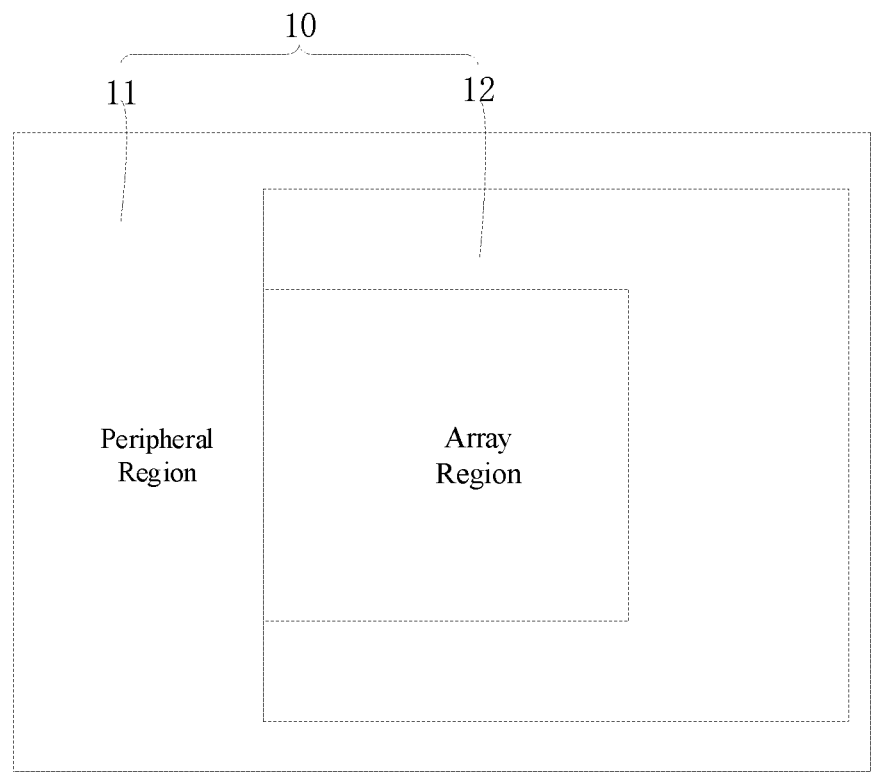
FIG. 2 is a vertical view of a substrate provided in the method for fabricating a semiconductor structure according to an embodiment of the present disclosure.

Referring to FIG. 1 and FIG. 2, an embodiment of the present disclosure provides a method for fabricating a semiconductor structure. The semiconductor structure generally includes a substrate 10 and a device layer arranged on the substrate 10. This method is configured for forming, on the substrate 10, a mating structure configured to mate with a device layer, including following steps.

Step S101: providing a substrate including an array region and a peripheral region.

Figure 3:
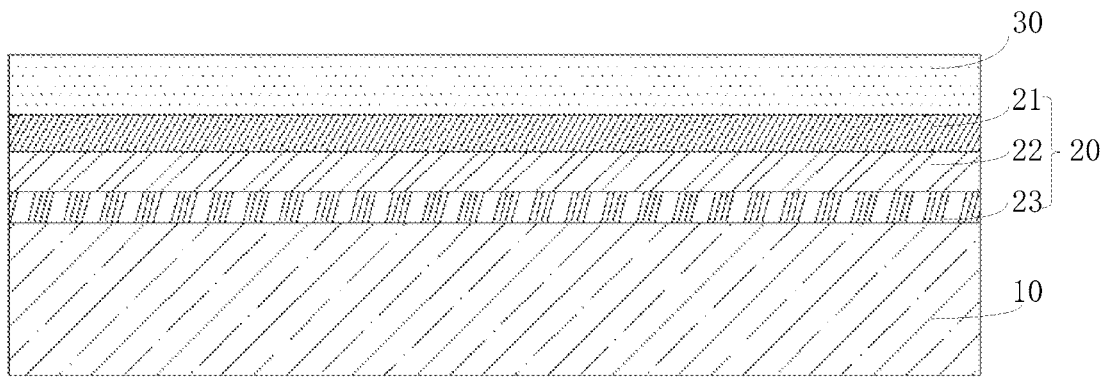
FIG. 3 is a schematic structural diagram of the substrate provided in the method for fabricating a semiconductor structure according to an embodiment of the present disclosure.

As shown in FIG. 2 and FIG. 3, the substrate 10 also includes a peripheral region 11 (a left side of a position as shown in FIG. 3) and an array region 12 (a right side of the position as shown in FIG. 3), and the array region 12 is adjacent to the peripheral region 11. Referring to FIG. 2, the peripheral region 11 may be arranged at the periphery of the array region 12. Of course, in some other examples, relative positions of the peripheral region 11 and the array region 12 may also be set according to actual needs, which is not restricted in this embodiment. The peripheral region 11 may be configured to, for example, form a mating structure configured to mate with a peripheral circuit, and the array region 12 may be configured to, for example, form a mating structure configured to mate with a memory cell. The array region 12 may also include different regions to mate with different types of memory cells. Of course, in some other examples, the mating structures of the peripheral region 11 and the array region 12 may also be configured to mate with other devices.

In this embodiment, the substrate 10 may be a semiconductor substrate 10 such as single-crystal silicon, polysilicon, or amorphous structure such as silicon or silicon germanium (SiGe), or may be a hybrid semiconductor structure, such as silicon carbide, indium antimonide, lead telluride, indium arsenide, indium phosphide, gallium arsenide or gallium antimonide, an alloy semiconductor, or a combination thereof. However, in this embodiment, types of the substrate 10 are not limited thereto.

Step S102: forming, on the substrate, a first mask layer covering the array region and the peripheral region, such that the first mask layer has a first device structure pattern directly facing the peripheral region and a second device structure pattern directly facing the array region.

In this embodiment, a part of a first mask layer 20 may be removed by means of etching, and then a first device structure pattern 211 and a second device structure pattern 212 are formed on the first mask layer 20. The first device structure pattern 211 directly faces the peripheral region 11, which is advantageous to forming a peripheral region structure 111 subsequently by using the first device structure pattern 211 as mask layer. The second device structure pattern 212 directly faces the array region 12, which is advantageous to forming an array region structure 121 by using the second device structure pattern 212 as mask layer.

As shown in FIG. 3, the first mask layer 20 includes an eleventh mask layer 21 and a twelfth mask layer 22, where the eleventh mask layer 21 is positioned on the twelfth mask layer 22. A material of the eleventh mask layer 21 may include an inorganic material, for example, a dielectric anti-reflective coating (DARC) such as silicon oxide ($SiO_2$), silicon (Si), and silicon-rich silicon oxynitride (SiON). For forming patterns with pitches close to resolution limit of photolithography, light reflection may be minimized by providing the eleventh mask layer 21 to enhance resolution, thereby increasing precision of photoengraving an edge of a definable pattern, such that precision of forming mask patterns on the eleventh mask layer 21 can be improved. A material of the twelfth mask layer 22 may include amorphous carbon, which is a material highly transparent to light (i.e., "transparent carbon"), and which provides improvement of alignment by being transparent to a wavelength of light for optical alignment. Further, the amorphous carbon has very high etching selectivity relative to a hard mask material used in the related technologies, which can further improve accuracy of forming a mask pattern on the twelfth mask layer 22.

With continued reference to FIG. 3, the first mask layer 20 further includes a thirteenth mask layer 23, which is positioned between the twelfth mask layer 22 and the substrate 10. A material of the thirteenth mask layer 23 may also include silicon nitride, silicon oxide, and silicon oxynitride, etc. When a photoengraving pattern is formed on the eleventh mask layer 21 and the twelfth mask layer 22, the substrate 10 can be protected by providing the thirteenth mask layer 23.

In this embodiment, after the forming, on the substrate 10, a first mask layer 20 covering the array region 12 and the peripheral region 11, such that the first mask layer 20 has a first device structure pattern 211 directly facing the peripheral region 11 and a second device structure pattern 212 directly facing the array region 12, the method also includes:

Step S103: etching the substrate by using the first device structure pattern and the second device structure pattern as mask layer to form the peripheral region structure and the array region structure, respectively.

Figure 13:
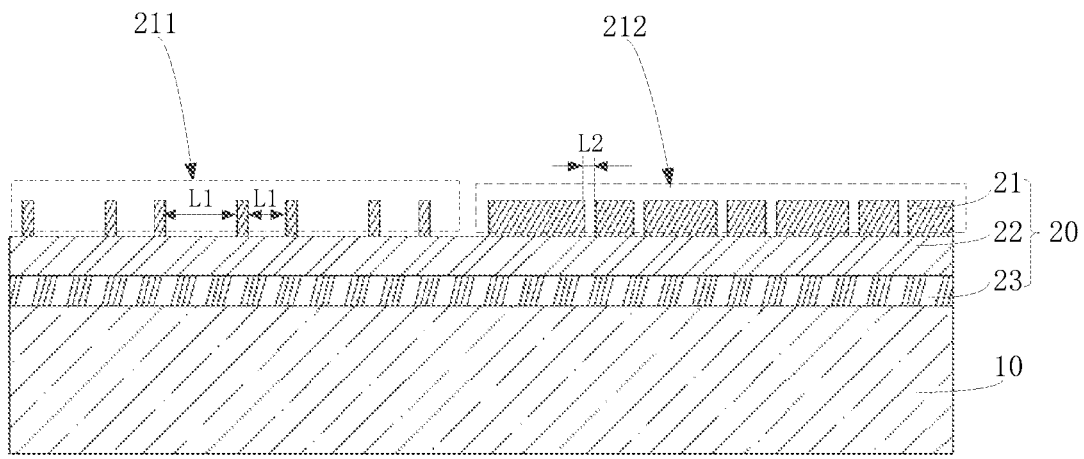
FIG. 13 is a schematic structural diagram showing a first device structure pattern and a second device structure pattern formed in the method for fabricating a semiconductor structure according to an embodiment of the present disclosure.

In some embodiments, a pattern density of the first device structure pattern 211 may be smaller than that of the second device structure pattern 212. As shown in FIG. 13, in the first device structure pattern 211, there is a first distance L1 between adjacent two of the plurality of rectangular blocks. It is worth noting that the first device structure pattern 211 in FIG. 13 is only exemplary. According to actual setting needs, the first distance L1 between any adjacent two of the plurality of rectangular blocks may be the same (that is, the plurality of rectangular blocks are arranged at equal distance) or may be different (that is, the plurality of rectangular blocks are arranged at unequal intervals). The second device structure pattern 212 includes a plurality of rectangular blocks arranged at intervals, and there is a second distance L2 between adjacent two of the plurality of rectangular blocks, where any first distance L1 is greater than the second distance L2. That is, the pattern density of the first device structure pattern 211 is smaller than that of the second device structure pattern 212. According to the embodiments of the present disclosure, the second device structure pattern 212 having a larger pattern density is first formed, then the first device structure pattern 211 having a smaller pattern density is formed, and then the substrate is synchronously etched. In this way, it is advantageous to protecting the first device structure pattern 211 having the smaller pattern density, and solving a problem of collapse of the first device structure pattern 211 having the smaller pattern density at a periphery. Moreover, it is advantageous to subsequently forming a corresponding peripheral region structure 111 and an array region structure 121 in the substrate 10, and ensuring a pattern density of the peripheral region structure 111 to be smaller than that of the array region structure 121, such that it is advantageous to subsequent formation of corresponding device layers on the peripheral region structure 111 and the array region structure 121.

In this embodiment, after the substrate 10 is etched by using the first device structure pattern 211 and the second device structure pattern 212 as mask layer to form the peripheral region structure 111 and the array region structure 121 respectively, the method also includes: forming a first storage structure and a second storage structure on the array region structure 121 to adapt to different usage requirements in the array region 12. In this embodiment, the first storage structure and the second storage structure may include different types of memory cells. The first storage structure may include, for example, a plurality of dynamic random access memory cells, and each of the plurality of dynamic random access memory cells includes a transistor structure and a capacitor structure. The second storage structure may include, for example, a plurality of magnetic random access memory cells, and each of the plurality of magnetic random access memory cells includes a transistor structure and a magnetoresistive tunnel junction interposed between two metal lines. A resistance value of the magnetoresistive tunnel junction is changed by controlling transistors in the transistor structure, to read/write data. Of course, in some other examples, the first storage structure and the second storage structure may also include memory cells using other storage principles.

An embodiment of the present disclosure provides a method for fabricating a semiconductor structure. The method includes: providing a substrate 10 comprising an array region 12 and a peripheral region 11; forming, on the substrate 10, a first mask layer 20 covering the array region 12 and the peripheral region 11, such that the first mask layer 20 has a first device structure pattern 211 directly facing the array region 12 and a second device structure pattern 212 directly facing the peripheral region 11; and etching the substrate 10 by using the first device structure pattern 211 and the second device structure pattern 212 as mask layer to form a peripheral region structure 111 and an array region structure 121, respectively. According to the method for fabricating a semiconductor structure provided by the embodiment of the present disclosure, the first mask layer 20 having the first device structure pattern 211 and the second device structure pattern 212 is first formed on the substrate 10, and then the substrate 10 is etched by using the first device structure pattern 211 and the second device structure pattern 212 as mask layer to synchronously form a peripheral region structure 111 and an array region structure 121 on the substrate 10, thereby simplifying technological processes, reducing fabrication difficulties, and improving production efficiencies.

In this embodiment, after the forming, on the substrate 10, a first mask layer 20 covering the array region 12 and the peripheral region 11, such that the first mask layer 20 has a first device structure pattern 211 directly facing the peripheral region 11 and a second device structure pattern 212 directly facing the array region 12, the method also includes: forming a first mask pattern 30 on the first mask layer 20.

Figure 4:
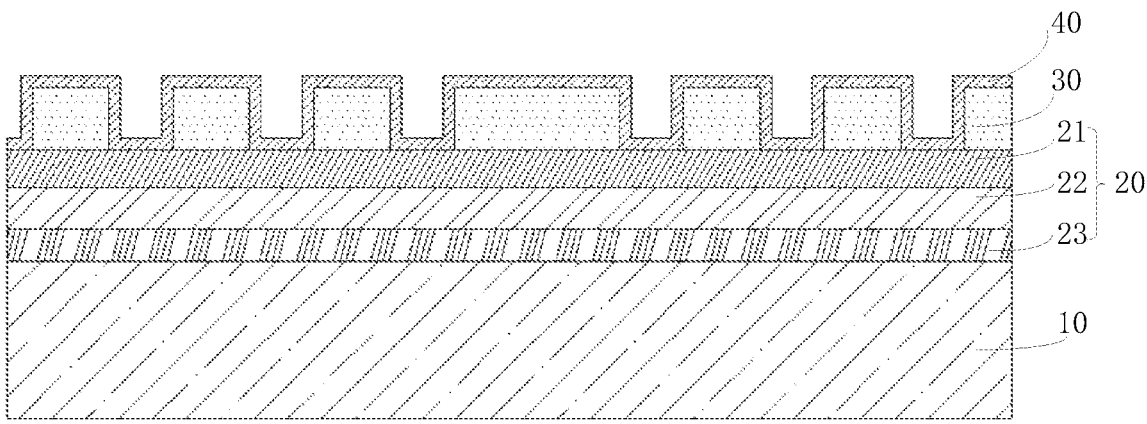
FIG. 4 is a schematic structural diagram showing a first mask pattern and a first dielectric layer formed in the method for fabricating a semiconductor structure according to an embodiment of the present disclosure.

As shown in FIG. 4, a projection of the first mask pattern 30 on the substrate 10 is positioned in the array region 12 and the peripheral region 11, such that the corresponding mating structures are respectively formed in the array region 12 and the peripheral region 11 of the substrate 10 subsequently by means of the first mask pattern 30.

In some embodiments, a pattern density of the first mask pattern 30 on the array region 12 is the same as a pattern density of the first mask pattern 30 on the peripheral region 11. The pattern density of the first mask pattern 30 on the array region 12 is the same as the pattern density of the first mask pattern 30 on the peripheral region 11, which simplifies the technological processes of forming the first mask pattern 30 and improves the production efficiencies.

Further, the first mask pattern 30 includes an elongated pattern. Exemplarily, the first mask pattern 30 includes a plurality of elongated patterns arranged at intervals. In this embodiment, the elongated patterns may be rectangular, for example. It should be noted that in some embodiments of the present disclosure, the peripheral region structure 111 and the array region structure 121 formed correspondingly by means of the first mask pattern 30 having the plurality of elongated patterns are also elongated. The peripheral region structure 111 and the array region structure 121 may be configured to form a part (e.g., a fin) of a Fin Field-Effect Transistor (FinFET), to improve performance of the semiconductor structure.

In a concrete implementation manner, a material of the first mask pattern 30 may include a hard mask material. A formation process of the first mask pattern 30 may include: forming a hard mask material layer on the first mask layer 20, and then etching the hard mask material layer to remove a part of the hard mask material, to form the corresponding first mask pattern 30. The hard mask material layer may be, for example, Spin on Hardmasks (SOH). As an auxiliary material for forming semiconductor fine patterns, the SOH is used as a membrane under a photoresist, and is used for facilitating a circuit to be transcribed to a target membrane to improve accuracy of the fine patterns and play an appropriate role of a defense film in the subsequent etching process. It should be noted that the material of the SOH is advantageous to achieving graphic accuracy of fine line width, thereby further improving the graphic accuracy of the first mask pattern 30.

In this embodiment, in the step of forming, on the substrate 10, a first mask layer 20 covering the array region 12 and the peripheral region 11, such that the first mask layer 20 has a first device structure pattern 211 directly facing the peripheral region 11 and a second device structure pattern 212 directly facing the array region 12, after the forming a first mask pattern 30 on the first mask layer 20, the method also includes: forming a first dielectric layer 40 on the first mask layer 20 and the first mask pattern 30.

As shown in FIG. 4, the first mask pattern 30 may cover a part of surface of the first mask layer 20. In the embodiment where the first mask pattern 30 includes a plurality of rectangular blocks arranged at intervals, the first mask layer 20 is exposed between adjacent two of the plurality of rectangular blocks. That is, the first mask pattern 30 may cover a part of surface of the first mask layer 20.

The forming a first dielectric layer 40 on the first mask layer 20 and the first mask pattern 30 also includes: conformally covering, by the first dielectric layer 40, a top surface and a sidewall of the first mask pattern 30 and the exposed surface of the first mask layer 20. With continued reference to FIG. 4, in this embodiment, the first dielectric layer 40 covers a sidewall of a given one of the plurality of rectangular blocks and an end surface (that is, the top surface of the first mask pattern 30) of the given rectangular block facing away from the substrate 10. The first dielectric layer 40 also covers the first mask layer 20 between adjacent two of the plurality of rectangular blocks (i.e., covering the exposed surface of the first mask layer 20).

In a concrete implementation manner, a material of the first dielectric layer 40 may include silicon oxide, silicon nitride, and silicon oxynitride, etc., such that the first dielectric layer 40 can protect the first mask pattern 30.

In this embodiment, in the step of forming, on the substrate 10, a first mask layer 20 covering the array region 12 and the peripheral region 11, such that the first mask layer 20 has a first device structure pattern 211 directly facing the peripheral region 11 and a second device structure pattern 212 directly facing the array region 12, after the forming a first dielectric layer 40 on the first mask layer 20 and the first mask pattern 30, the method also includes: forming a second mask layer on the first dielectric layer 40 in the peripheral region 11.

Figure 5:
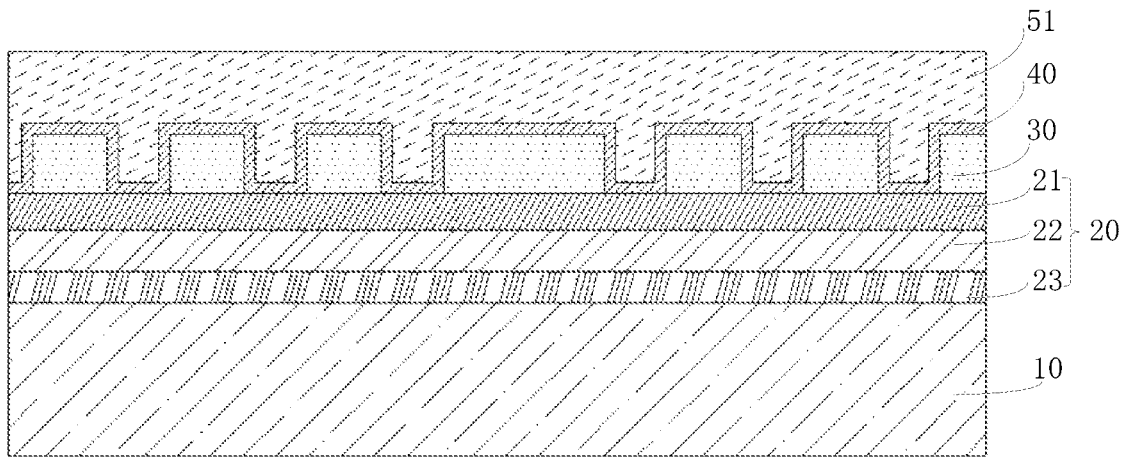
FIG. 5 is a schematic structural diagram showing a twenty-first mask layer formed in the method for fabricating a semiconductor structure according to an embodiment of the present disclosure.

In this embodiment, the step of forming a second mask layer on the first dielectric layer 40 in the array region 12 may include: forming a twenty-first mask layer 51 on the first dielectric layer 40, and forming a twenty-second mask layer 52 on the twenty-first mask layer 51. As shown in FIG. 5, a projection of the twenty-first mask layer 51 on the substrate 10 is positioned in the array region 12 and the peripheral region 11, and the twenty-second mask layer 52 is positioned on the twenty-first mask layer 51.

In this embodiment, a sidewall of the first dielectric layer 40 is positioned on a surface of the first dielectric layer 40 covering the sidewall of the first mask pattern 30, and a top surface of the first dielectric layer 40 is positioned on the surface of the first dielectric layer 40 covering the top surface of the first mask layer 20. As shown in FIG. 5, the twenty-first mask layer 51 may cover the top surface and the sidewall of the first dielectric layer 40. Further, the sidewall of the first dielectric layer 40 and the first dielectric layer 40 covering the exposed first mask layer 20 may surround and form a groove, and the twenty-first mask layer 51 also fills up the groove.

In a concrete implementation manner, a material of the twenty-first mask layer 51 may include a hard mask material, such as SOH. It is to be noted that a material of the SOH may have characteristics of filling gaps, increasing flatness and enhancing corrosion resistance, which may facilitate the twenty-first mask layer 51 to fill up the groove of the first dielectric layer 40 and facilitate to maintain the flatness of the twenty-first mask layer 51. Further, the twenty-first mask layer 51 can also protect the first dielectric layer 40.

In this embodiment, in the step of forming, on the substrate 10, a first mask layer 20 covering the array region 12 and the peripheral region 11, such that the first mask layer 20 has a first device structure pattern 211 directly facing the peripheral region 11 and a second device structure pattern 212 directly facing the array region 12, after the forming a second mask layer on the first dielectric layer 40 in the peripheral region 11, the method also includes: forming a second mask pattern 42 on the array region 12; and forming the second device structure pattern 212 on the first mask layer 20 by using the second mask pattern 42 as mask layer.

Figure 6:
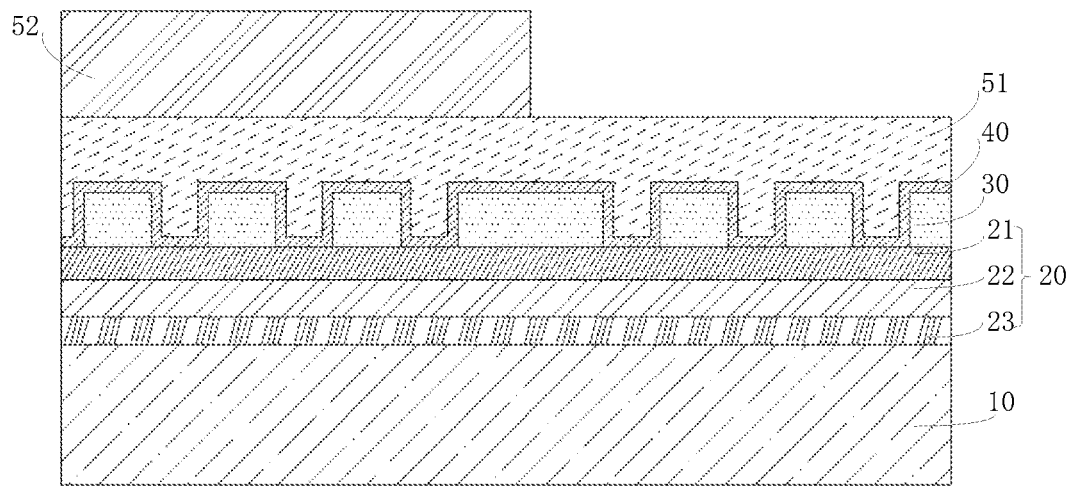
FIG. 6 is a schematic structural diagram obtained after a part of a twenty-second mask layer is removed in the method for fabricating a semiconductor structure according to an embodiment of the present disclosure.

In this embodiment, referring to FIG. 6, the step of forming a second mask pattern 42 on the peripheral region 11 includes: removing the twenty-second mask layer 52 on the array region 12 and the twenty-first mask layer 51 and the first dielectric layer 40 on the top of the first mask pattern 30; and removing the first dielectric layer 40 positioned on the sidewall of the first mask pattern 30 on the array region 12 to form the second mask pattern 42.

Figure 7:
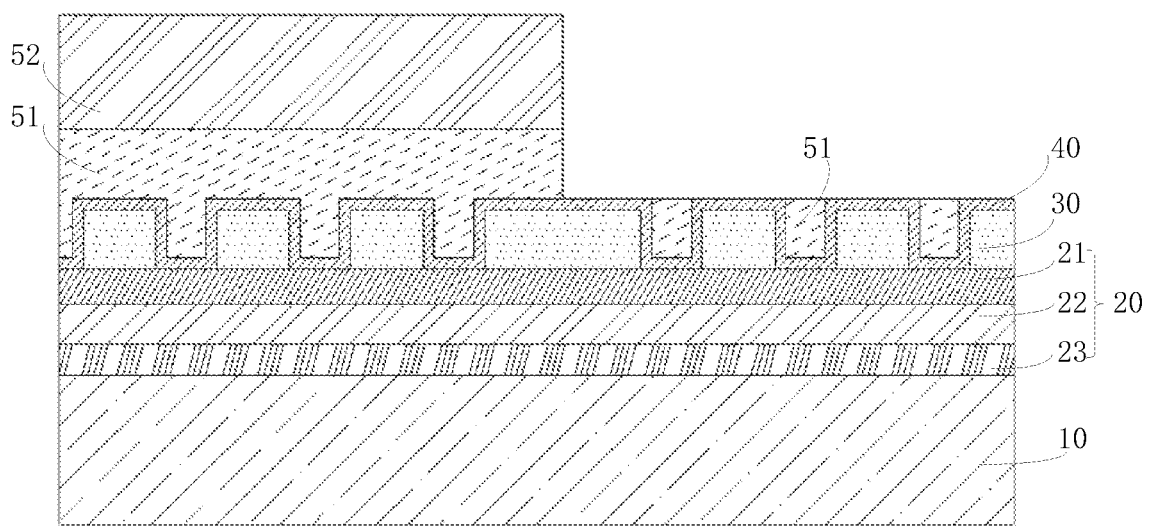
FIG. 7 is a schematic structural diagram obtained after a part of the twenty-first mask layer is removed in the method for fabricating a semiconductor structure according to an embodiment of the present disclosure.

It is to be noted that referring to FIG. 7, the twenty-second mask layer 52 and a part of the twenty-first mask layer 51 may be removed first to expose the first dielectric layer 40 covering the top surface of the first mask pattern 30.

In a concrete implementation manner, a material of the twenty-second mask layer 52 may include a photoresist. A formation process of the twenty-second mask layer 52 is briefly described as below by taking an example where the material of the twenty-second mask layer 52 is a positive photoresist. The positive photoresist is coated on the twenty-first mask layer 51 to form the twenty-second mask layer 52, then a photomask is formed on the twenty-second mask layer 52, such that the photomask can shield the positive photoresist whose projection is in the peripheral region 11, and then exposure and development are performed on rest of the exposed positive photoresist to remove the initial twenty-second mask layer 52 whose projection is in the array region 12.

After the twenty-second mask layer 52 on the array region 12 is removed, the first dielectric layer 40 covering the top surface of the first mask pattern 30 is removed, and a part of the twenty-first mask layer 51 is removed synchronously, such that an end surface of the twenty-first mask layer 51 facing away from the substrate 10 is flush with the top surface of the first mask pattern 30. Next, the first dielectric layer 40 covering the sidewall of the first mask pattern 30 is removed, to retain the first mask pattern 30, a part of the first dielectric layer 40 and a part of the twenty-first mask layer 51 in the array region 12. In this way, the second mask pattern 42 is formed.

Figure 8:
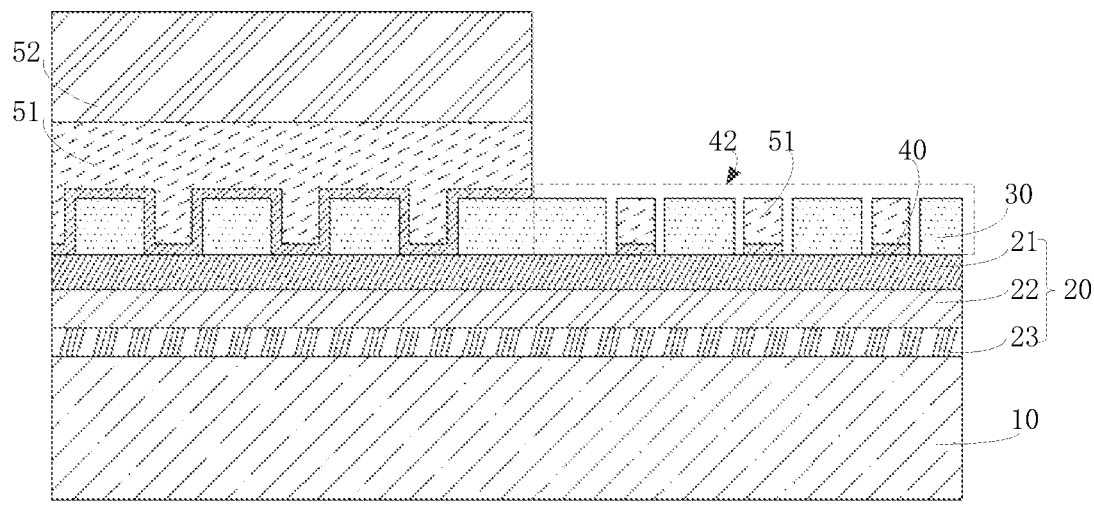
FIG. 8 is a schematic structural diagram showing a second mask pattern formed in the method for fabricating a semiconductor structure according to an embodiment of the present disclosure.

With reference to FIG. 8, the second mask pattern 42 may include a plurality of rectangular blocks arranged at intervals. Of course, in some other examples, a shape of the second mask pattern 42 may be adjusted by setting a shape of the first mask pattern 30 and a film-forming thickness of the first dielectric layer 40, where the shape of the second mask pattern 42 is not particularly limited in this embodiment.

In this embodiment, after the second mask pattern 42 is formed on the array region 12, the method also includes: forming the second device structure pattern 212 on the first mask layer 20 by using the second mask pattern 42 as mask layer.

Figure 9:
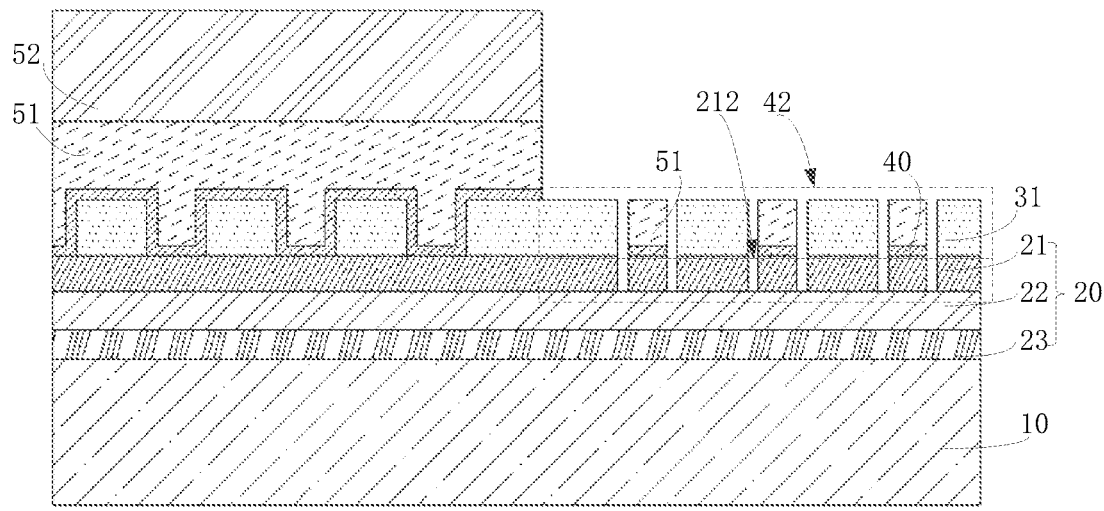
FIG. 9 is a schematic structural diagram showing a second device structure pattern formed in the method for fabricating a semiconductor structure according to an embodiment of the present disclosure.
Figure 12:
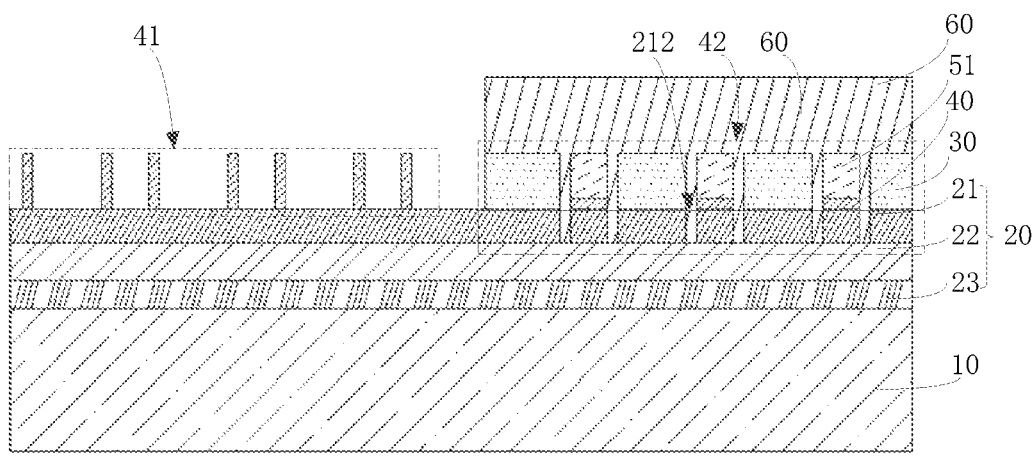
FIG. 12 is a schematic structural diagram showing the first mask pattern formed in the method for fabricating a semiconductor structure according to an embodiment of the present disclosure.

Referring to FIG. 8 and FIG. 9, to form the second device structure pattern 212, it is required to remove a part of the first mask layer 20 by using the second mask pattern 42 as mask layer. In this embodiment, the eleventh mask layer 21 on the array region 12 is etched by using the second mask pattern 42 as mask layer to form the second device structure pattern 212. As shown in FIG. 12 and FIG. 13, a shape of the second device structure pattern 212 is the same as that of the second mask pattern 42, where the second device structure pattern 212 may include a plurality of rectangular blocks arranged at intervals. Further, in some other examples, the shape of the second device structure pattern 212 may be adjusted by setting the shape of the second mask pattern 42, and the shape of the second device structure pattern 212 is not particularly limited in this embodiment.

In this embodiment, in the step of forming, on the substrate 10, a first mask layer 20 covering the array region 12 and the peripheral region 11, such that the first mask layer 20 has a first device structure pattern 211 directly facing the peripheral region 11 and a second device structure pattern 212 directly facing the array region 12, after the forming a second mask pattern 42 on the array region 12 and forming the second device structure pattern 212 on the first mask layer 20 by using the second mask pattern 42 as mask layer, the method also includes: forming a third mask layer 60 on the second device structure pattern 212.

As shown in FIG. 9, in the embodiment where in the first mask layer 20, the second device structure pattern 212 is shaped like a plurality of rectangular blocks arranged at intervals, the second device structure pattern 212 is formed in the eleventh mask layer 21, and the second device structure pattern 212 covers a part of the twelfth mask layer 22, such that a part of the twelfth mask layer 22 is exposed between adjacent two of the plurality of rectangular blocks. The third mask layer 60 conformally covers the eleventh mask layer 21 and the exposed twelfth mask layer 22.

In this embodiment, the step of forming a third mask layer 60 on the second device structure pattern 212 may include: forming an initial third mask layer 60 on the first dielectric layer 40, and then removing the initial third mask layer 60 on the peripheral region 11 to form the third mask layer 60.

In a concrete implementation manner, a material of the third mask layer 60 may include a photoresist. A formation process of the third mask layer 60 is briefly described as below by taking an example where the material of the third mask layer 60 is a positive photoresist. The positive photoresist is coated on the second device structure pattern 212 and the second mask layer to form the initial third mask layer 60, then a photomask is formed on the initial third mask layer 60, such that the photomask can shield the positive photoresist whose projection is in the array region 12, and then exposure and development are performed on rest of the exposed positive photoresist to remove the initial third mask layer 60 whose projection is in the peripheral region 11. That is, the initial third mask layer 60 covered on the second mask layer is removed. In this way, the third mask layer 60 is formed.

It is to be noted that in an embodiment where the material of the third mask layer 60 and the material of the twenty-second mask layer 52 are both the positive photoresist, a photomask is formed on the initial third mask layer 60, such that the photomask can shield the photoresist whose projection is in the array region 12, and then exposure and development are performed on rest of the exposed photoresist to remove the initial third mask layer 60 whose projection is in the peripheral region 11, such that the twenty-second mask layer 52 is exposed. At this moment, the twenty-second mask layer 52 covering the peripheral region 11 may be further removed by means of exposure and development to expose the twenty-first mask layer 51, which may facilitate to further remove the twenty-first mask layer 51 subsequently to form a third mask pattern 41 on the peripheral region 11. In some other examples, both the material of the third mask layer 60 and the material of the twenty-second mask layer 52 may also be a negative photoresist, and the process thereof is not to be repeated here.

In this embodiment, in the step of forming, on the substrate 10, a first mask layer 20 covering the array region 12 and the peripheral region 11, such that the first mask layer 20 has a first device structure pattern 211 directly facing the peripheral region 11 and a second device structure pattern 212 directly facing the array region 12, after the forming a third mask layer 60 on the second device structure pattern 212, the method also includes: forming a third mask pattern 41 on the peripheral region 11; and forming the first device structure pattern 211 on the first mask layer 20 by using the third mask pattern 41 as mask layer.

In this embodiment, the step of forming a third mask pattern 41 on the peripheral region 11 includes: removing the first mask pattern 30 and a part of the first dielectric layer 40 on the peripheral region 11, and retaining the first dielectric layer 40 positioned on a sidewall of the first mask pattern 30 to form a second mask pattern 42.

It is to be noted that before removing the first mask pattern 30 and a part of the first dielectric layer 40 on the peripheral region 11, the second mask layer on the peripheral region 11 needs to be first removed to expose the first mask pattern 30 and the first dielectric layer 40.

Figure 10:
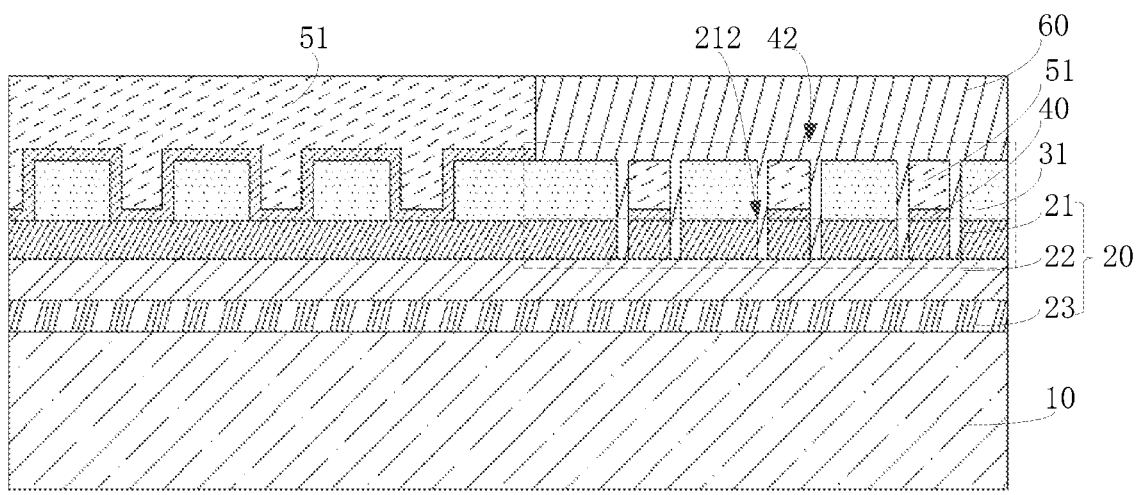
FIG. 10 is a schematic structural diagram showing a third mask layer formed in the method for fabricating a semiconductor structure according to an embodiment of the present disclosure.
Figure 11:
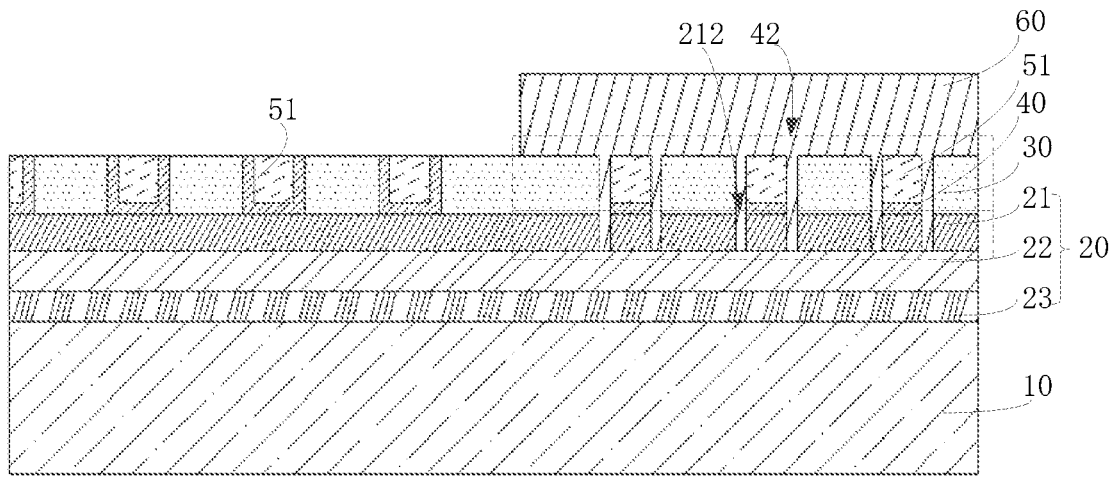
FIG. 11 is a schematic structural diagram obtained after a part of a second mask layer is removed in the method for fabricating a semiconductor structure according to an embodiment of the present disclosure.

As shown in FIG. 10, FIG. 11 and FIG. 12, in this embodiment, the first dielectric layer 40 covering the top surface of the first mask pattern 30 may be removed first to expose the first mask pattern 30. Next, the first mask pattern 30 and the first dielectric layer 40 covering the first mask layer 20 are removed, and the first dielectric layer 40 covering the sidewalls of the first mask pattern 30 is retained to form the third mask pattern 41.

With continued reference to FIG. 12, the third mask pattern 41 may include a plurality of rectangular blocks arranged at intervals. Of course, in some other examples, a shape of the third mask pattern 41 may be adjusted by setting the shape of the first mask pattern 30 and a film-forming thickness of the first dielectric layer 40, where the shape of the third mask pattern 41 is not particularly limited in this embodiment.

In this embodiment, after the third mask pattern 41 is formed on the peripheral region 11, the method also includes: forming the first device structure pattern 211 on the first mask layer 20 by using the third mask pattern 41 as mask layer.

Figure 14:
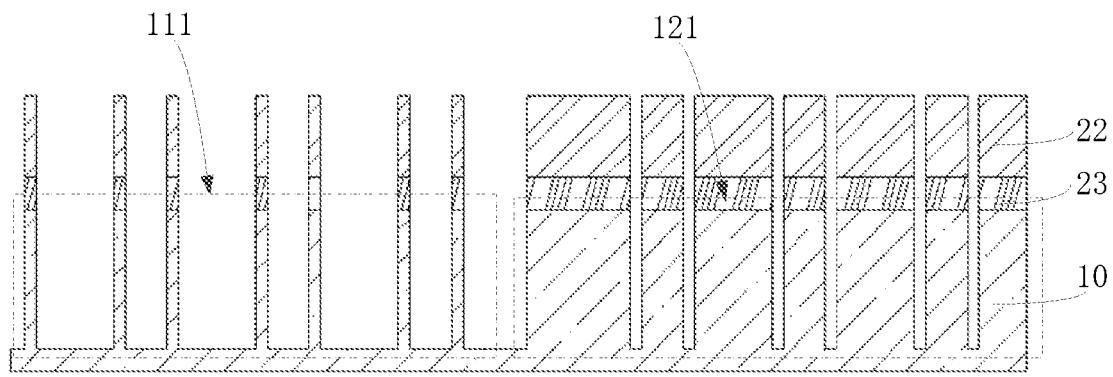
FIG. 14 is a schematic structural diagram obtained after a part of the first mask layer is removed in the method for fabricating a semiconductor structure according to an embodiment of the present disclosure.
Figure 15:
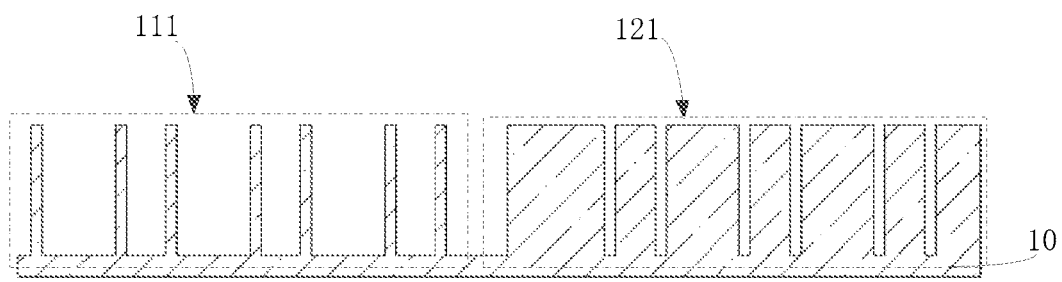
FIG. 15 is a schematic structural diagram showing a peripheral region structure and an array region structure formed in the method for fabricating a semiconductor structure according to an embodiment of the present disclosure.

Referring to FIG. 13, FIG. 14 and FIG. 15, to form the first device structure pattern 211, it is required to remove a part of the first mask layer 20 by using the third mask pattern 41 as mask layer. In this embodiment, the eleventh mask layer 21 on the peripheral region 11 is etched by using the third mask pattern 41 as mask layer to form the first device structure pattern 211. As shown in FIG. 12 and FIG. 13, a shape of the first device structure pattern 211 is the same as that of the third mask pattern 41, where the first device structure pattern 211 may include a plurality of rectangular blocks arranged at intervals. Further, in some other examples, the shape of the first device structure pattern 211 may be adjusted by setting the shape of the third mask pattern 41, and the shape of the first device structure pattern 211 is not particularly limited in this embodiment.

In this embodiment, before etching the substrate 10 by using the second device structure pattern 212 as mask layer, the method further includes: removing the third mask layer 60 to expose the second device structure pattern 212 and a part of the substrate 10 positioned in the array region 12, which facilitates to etch the substrate 10 subsequently by using the second device structure pattern 212 as mask layer.

Further, as shown in FIG. 14, before etching the substrate 10 by using the first device structure pattern 211 as mask layer, the method also includes: removing the first mask pattern 30, the first dielectric layer 40 and the twenty-first mask layer 51 in the array region 11, to expose the first device structure pattern 211 in the array region 11 and a part of the substrate 10, which may facilitate subsequent etching of the substrate 10 by using the first device structure pattern 211 as mask layer.

In this embodiment, before etching the substrate 10 by using the first device structure pattern 211 and the second device structure pattern 212 as mask layer, the method also includes: etching the twelfth mask layer 22 and the thirteenth mask layer 23 by using the first device structure pattern 211 and the second device structure pattern 212 as mask layer, to avoid a subsequent etching effect on the substrate 10.

An embodiment of the present disclosure also provides a semiconductor structure including a substrate 10, which includes an array region 12 and a peripheral region 11, where the peripheral region 11 has a peripheral region structure 111, and the array region 12 has an array region structure 121. A method for fabricating the peripheral region structure 111 and the array region structure 121 includes: forming, on the substrate 10, a first mask layer 20 covering the array region 12 and the peripheral region 11; forming a first mask pattern 30 on the first mask layer 20; forming a first dielectric layer 40 on the first mask layer 20 and the first mask pattern 30, and forming a second mask layer on the first dielectric layer 40 of the array region 12; forming a second mask pattern 42 on the peripheral region 11; forming a first device structure pattern 211 on the first mask layer 20 by using the second mask pattern 42 as mask layer; forming a third mask layer 60 on the first dielectric layer 40 of the peripheral region 11; forming a third mask pattern 41 on the array region 12; forming a second device structure pattern 212 on the first mask layer 20 by using the third mask pattern 41 as mask layer; and etching the substrate 10 by using the first device structure pattern 211 and the second device structure pattern 212 as mask layer to form the peripheral region structure 111 and the array region structure 121, respectively. According to the method for fabricating a semiconductor structure provided by the embodiment of the present disclosure, the first mask layer 20 having the first device structure pattern 211 and the second device structure pattern 212 is first formed on the substrate 10, and then the substrate 10 is etched by using the first device structure pattern 211 and the second device structure pattern 212 as mask layer to synchronously form a peripheral region structure 111 and an array region structure 121 on the substrate 10, thereby simplifying technological processes, reducing fabrication difficulties, and improving production efficiencies.

Those skilled in the art may clearly understand that for the convenience and brevity of description, division of the above functional modules is merely taken as an example for illustration. In actual applications, the foregoing functions may be allocated to different functional modules and implemented according to needs. That is, an internal structure of an apparatus is divided into different functional modules to implement all or a part of the functions described above. For a detailed working process of the apparatus described above, reference may be made to the corresponding process in the foregoing method embodiments, and details are not described herein again.

Finally, it should be noted that the foregoing embodiments are merely intended for describing the technical solutions of the present disclosure, but not for limiting the present disclosure. Although the present disclosure is described in detail with reference to the foregoing embodiments, persons of ordinary skill in the art should understand that they may still make modifications to the technical solutions described in the foregoing embodiments or make equivalent replacements to some or all technical features thereof, which does not make corresponding technical solutions in essence depart from the scope of the technical solutions of the embodiments of the present disclosure.

What is claimed is:

1. A method for fabricating a semiconductor structure, comprising:
   providing a substrate comprising an array region and a peripheral region;
   forming, on the substrate, a first mask layer covering the array region and the peripheral region, such that the first mask layer has a first device structure pattern over the peripheral region and a second device structure pattern over the array region; and
   etching the substrate by using the first device structure pattern and the second device structure pattern as mask layer to form a peripheral region structure and an array region structure, respectively,
   wherein the forming, on the substrate, a first mask layer covering the array region and the peripheral region, such that the first mask layer has a first device structure pattern directly facing the peripheral region and a second device structure pattern directly facing the array region comprises:
   forming a first mask pattern on the first mask layer;
   forming a first dielectric layer on the first mask layer and the first mask pattern;
   forming a second mask layer on the first dielectric layer;
   forming a second mask pattern on the array region; and
      forming the second device structure pattern on the first mask layer by using the second mask pattern as mask layer;
   forming a third mask layer on the second device structure pattern; and
   forming a third mask pattern on the peripheral region; and
      forming the first device structure pattern on the first mask layer by using the third mask pattern as mask layer.

2. The method for fabricating a semiconductor structure according to claim 1, wherein the first mask layer comprises an eleventh mask layer and a twelfth mask layer, the eleventh mask layer being positioned on the twelfth mask layer;
   etching the eleventh mask layer above the array region by using the second mask pattern as mask layer to form the second device structure pattern; and
   etching the eleventh mask layer on the peripheral region by using the third mask pattern as mask layer to form the first device structure pattern.

3. The method for fabricating a semiconductor structure according to claim 2, wherein the first mask layer further comprises a thirteenth mask layer positioned between the twelfth mask layer and the substrate; and
   before etching the substrate by using the first device structure pattern and the second device structure pattern as mask layer, the twelfth mask layer and the thirteenth mask layer are etched in sequence by using the first device structure pattern and the second device structure pattern as mask layer.

4. The method for fabricating a semiconductor structure according to claim 1, wherein the forming a second mask pattern on the array region comprises:
removing a part of the second mask layer on the array region and the first dielectric layer positioned on a sidewall of the first mask pattern on the array region to form the second mask pattern.

5. The method for fabricating a semiconductor structure according to claim 4, wherein the second mask layer comprises a twenty-first mask layer and a twenty-second mask layer, the twenty-first mask layer covering a top surface and a sidewall of the first dielectric layer, and the twenty-second mask layer being positioned on the twenty-first mask layer.

6. The method for fabricating a semiconductor structure according to claim 5, wherein the twenty-second mask layer on the array region, the twenty-first mask layer and the first dielectric on a top of the first mask pattern are removed; and
the first dielectric layer positioned on the sidewall of the first mask pattern on the array region is removed to form the second mask pattern.

7. The method for fabricating a semiconductor structure according to claim 1, wherein the forming a third mask pattern on the peripheral region comprises:
removing the first mask pattern and a part of the first dielectric layer on the peripheral region, and retaining the first dielectric layer positioned on a sidewall of the first mask pattern to form the third mask pattern.

8. The method for fabricating a semiconductor structure according to claim 1, wherein the forming a first dielectric layer on the first mask layer and the first mask pattern comprises:
covering, by the first mask pattern, a part of surface of the first mask layer; and
conformally covering, by the first dielectric layer, a top surface and a sidewall of the first mask pattern and an exposed surface of the first mask layer.

9. The method for fabricating a semiconductor structure according to claim 1, wherein before etching the substrate by using the first device structure pattern and the second device structure pattern as mask layer, the method further comprises:
removing the third mask layer.

10. The method for fabricating a semiconductor structure according to claim 1, wherein a pattern density of the first device structure pattern is smaller than a pattern density of the second device structure pattern.

11. The method for fabricating a semiconductor structure according to claim 1, wherein a pattern density of the first mask pattern on the array region is the same as a pattern density of the first mask pattern on the peripheral region.

12. The method for fabricating a semiconductor structure according to claim 11, wherein the first mask pattern comprises an elongated pattern.

13. The method for fabricating a semiconductor structure according to claim 1, wherein after etching the substrate by using the first device structure pattern and the second device structure pattern as mask layer, the method further comprises:
forming a first storage structure and a second storage structure on the array region structure.

14. A semiconductor structure being formed by means of a method, wherein the method comprises:
providing a substrate comprising an array region and a peripheral region;
forming, on the substrate, a first mask layer covering the array region and the peripheral region, such that the first mask layer has a first device structure pattern over the peripheral region and a second device structure pattern over the array region; and
etching the substrate by using the first device structure pattern and the second device structure pattern as mask layer to form a peripheral region structure and an array region structure, respectively, wherein the forming, on the substrate, a first mask layer covering the array region and the peripheral region, such that the first mask layer has a first device structure pattern directly facing the peripheral region and a second device structure pattern directly facing the array region comprises:
forming a first mask pattern on the first mask layer;
forming a first dielectric layer on the first mask layer and the first mask pattern;
forming a second mask layer on the first dielectric layer;
forming a second mask pattern on the array region; and
forming the second device structure pattern on the first mask layer by using the second mask pattern as mask layer;
forming a third mask layer on the second device structure pattern; and
forming a third mask pattern on the peripheral region; and
forming the first device structure pattern on the first mask layer by using the third mask pattern as mask layer.

* * * * *